United States Patent [19]

Ross

[11] Patent Number: 5,572,070
[45] Date of Patent: Nov. 5, 1996

[54] INTEGRATED CIRCUIT PACKAGES WITH HEAT DISSIPATION FOR HIGH CURRENT LOAD

[75] Inventor: Richard J. Ross, Moraga, Calif.

[73] Assignee: RJR Polymers, Inc., Oakland, Calif.

[21] Appl. No.: 383,511

[22] Filed: Feb. 6, 1995

[51] Int. Cl.⁶ .......................... H01L 23/10; H01L 23/12; H01L 23/34
[52] U.S. Cl. .......................... 257/713; 257/675; 257/704; 257/706; 257/707
[58] Field of Search ............................ 257/713, 704, 257/675, 706, 707

[56] References Cited

U.S. PATENT DOCUMENTS 5,396,403  3/1995  Patel ........................................ 257/713
5,455,457  10/1995  Kurokawa ................................ 257/713

Primary Examiner—Sara W. Crane
Assistant Examiner—Valencia Martin Wallace
Attorney, Agent, or Firm—Townsend and Townsend and Crew LLP

[57] ABSTRACT

An integrated circuit package capable of carrying high wattage and efficiently dissipating heat generated by the die is fabricated from a die, printed wiring board and metal lid, with a beta-stageable resin which is preapplied to the lid and which contains a thermally conductive filler material. With the lid in place over the die and substrate board, the package is heated to cause the resin to flow and establish contact with the die. Further heating causes curing of the resin and a permanent thermal bridge between the die and the lid.

23 Claims, 2 Drawing Sheets

INTEGRATED CIRCUIT PACKAGES WITH HEAT DISSIPATION FOR HIGH CURRENT LOAD

This invention resides in the field of integrated circuit packages, and provides in particular a package capable of accommodating a high-wattage integrated circuit and dissipating the heat generated by the circuit.

BACKGROUND OF THE INVENTION

Integrated circuits are in such wide use now that the typical consumer relies on one or more of them several times each day, and takes for granted the sophisticated technology embodied in these circuits. The best known integrated circuits are incorporated into chips made of such materials as silicon or gallium arsenide and referred to by the industry as "dies," each die containing a multitude of circuit elements capable of performing complex electronic functions.

In use, these dies are incorporated into electronic systems which access the circuitry in the dies and to which the dies contribute their own specific functions. Incorporation into these systems is achieved in a variety of ways. Typically, the die is mounted to a substrate such as a printed wiring board, with wire leads joining the circuitry of the die to that of the board. The die and the wire leads joining the circuitry of the die to that of the board are protected either by a concave lid of either metal or plastic, bonded along its rim to areas of the board beyond the wire leads, or by embedding the die and wire leads in a shaped mound of molding compound molded in place by transfer molding or similar methods. In either case, the printed wiring board and protective cover form a housing for the die, and the combination of board, die and cover is termed a "package."

The use of molding compounds entails certain disadvantages over metal or plastic lids. One disadvantage is that molding compounds are generally heat insulators, causing the die to accumulate heat which can interfere with the functional performance of the package. Another disadvantage is the occurrence of frequency drifts in high frequency devices operating above one gigaherz, the drifts being caused by contact of the die with the molding compound.

With either type of protective covering, the assembled package has additional leads and contact areas on the periphery or the underside of the board which remain available for connections to external electronic circuits. Pin grid array packages are those with exposed pins to form the connections, and ball grid array packages are those with solder balls for the same purpose. The use of pin grid array packages with external circuitry is often referred to as "plug-in" technology.

A concern in the fabrication of integrated circuit packages is the heat generated by the current passing through the circuit, and the accompanying risk of burnout of the die. To prevent burnout, many packages in current use are limited to 2 watts. For dies designed to carry higher currents, however, the heat generation requires a heat sink or other means of dissipating the heat to avoid burnout. Conventional packages themselves cannot dissipate high amounts of heat, since printed wiring boards are typically fabricated of ceramic for the high reliability needed in military and industrial applications, or of plastic for low-cost commercial and consumer products, and both of these materials are thermal insulators.

High current density with effective heat dissipation has been achieved in plug-in packages which have substrates made of alumina ceramic, since alumina ceramic is a good heat conductor and the heat dissipation is augmented by the metal pins. Packages of this type are relatively costly, however.

To increase heat dissipation, special structures for both the substrate board and the cover have been devised. Metal sheets, for example, have been laminated into board structures to serve as heat spreaders. This requires a specially constructed board, however, both to incorporate the metal sheet and to avoid interference of the sheet with the circuitry in the board. In molded packages, heat-dissipating fin structures have been bonded to external surfaces of the packages. This unfortunately increases the bulk of the package and still relies on transmission of the heat through the molding compound to the fin structure.

SUMMARY OF THE INVENTION

An integrated circuit package and a method for its assembly have now been developed which provide effective heat transfer from the die to a metal lid without requiring additional fabrication steps beyond the conventional method of sealing the metal lid to the substrate board. A thermoplastic heat-curable resin containing a thermally conductive filler material is adhered to the undersurface (i.e., the concave inner surface) of the concave lid prior to the securement of the lid to the substrate. With the lid in position over the die, a stable heat bridge is formed by applying heat to the lid, thereby rendering the resin flowable to bridge the gap between the opposing surfaces of the die and the lid, and subsequently curing the resin to solid form.

In current fabrication procedures, the metal lid is secured to the substrate by either a paste adhesive or a beta-stageable adhesive applied to the mating surfaces of the lid (i.e., the peripheral rim of the lid) and substrate. Beta-stageable adhesives are cured in place by heating, and the seal is created by the combination of heat and pressure which cause the adhesive to flow and thereby establish a reliable contact between the surfaces prior to curing. In preferred embodiments of the present invention, a single heating and pressing process is used to simultaneously cure the resin on the inner concave surface of the lid and cure the edge adhesive bonding the lid to the substrate. Preferably, both the resin and the adhesive are in a tack-free semi-solid state prior to curing, and the adhesive, like the resin, is pre-applied to one of the two mating surfaces, i.e. , either the lid rim or the substrate.

The present invention resides in the combination of the substrate, die and lid with the filler-containing resin preapplied to the lid, in individual form ready for assembly and curing. The invention also resides in the metal lid itself with the filler-containing resin preapplied. The invention further resides in a method for assembling the components and thereby achieving an integrated circuit package with effective thermal conduction from the die to the lid.

These and other features and aspects of the invention are described in more detail below

DETAILED DESCRIPTION OF THE INVENTION AND PREFERRED EMBODIMENTS

Figure 1:
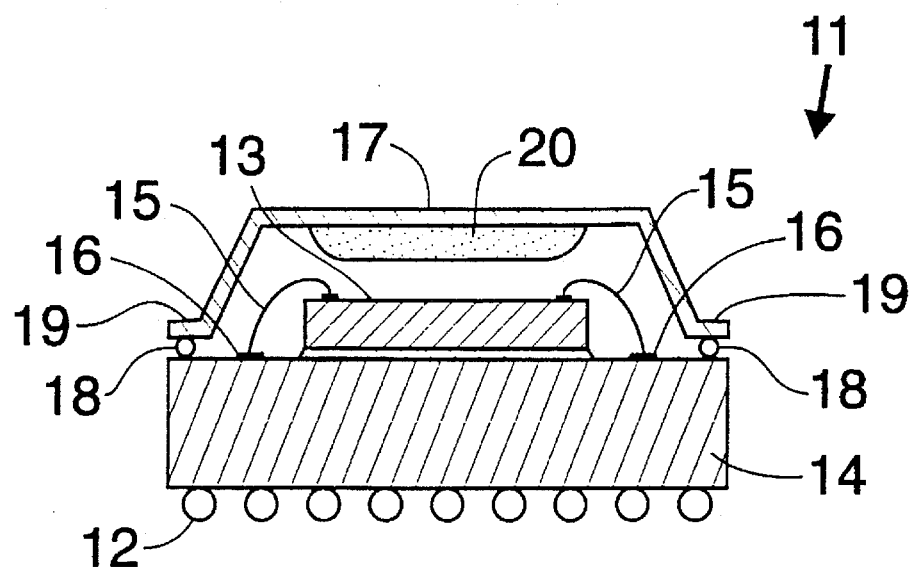
FIG. 1 is a side cross section of an integrated circuit package in accordance with the present invention, prior to sealing.

The filler-containing resin which forms the heat bridge between the die and the metal lid is preapplied to the lid on the undersurface which will face the die. The lid itself can be identical to any of the lids presently used in the manufacture of integrated circuit packages, or it may be a lid specially made for use in this invention. Lids currently in existence vary widely in length, width and depth (concavity), but are generally rectangular in shape, with a peripheral rim or flange which provides a surface along which the lid can be bonded to the substrate. The central portion of the lid is recessed relative to the flange to provide the concave shape, and is generally planar.

The metal of which the lid is made is preferably one with a high thermal conductivity, but also one which can be bonded to the printed wiring board to which the lid is to be sealed and which will have a similar response to temperature variations. Selection of the optimal metal will thus depend on the board material, and the most durable packages will be those in which the board and the lid have coefficients of thermal expansion which are close in value. Examples of metals which can be used in general are steel (316 or 302 stainless steel, or plated carbon steel, for example), copper, nickel, zinc and chromium. Preferred among these are steel and copper. Copper plated with nickel is particularly preferred for both high conductivity and oxidation resistance.

The filler-containing resin is preferably a beta-stageable resin in tack-free semi-solid form containing a particulate filler of high heat conductivity. Examples of resin materials suitable for use in this invention are silicones, epoxies, polyurethanes, polyimides, polyolefins, polyesters, phenolic resins, alkyd resins, and acrylic resins. Of these, silicones, epoxies, and polyurethanes are preferred. Examples of epoxy resins are digylcidyl ethers of bisphenol A, cresol-novolak resins, phenol-novolak resins, bisphenol F resins, and amin-based glycidyl ethers.

The resin will frequently contain additional ingredients such as curing agents, antifoaming agents, and fillers to add bulk and other properties, as opposed to the filler included for thermal conductivity. Examples of curing agents are polyamines, polyamides, polyphenols, polymeric thiols, polycarboxylic acids, anhydrides, dicyandiamide, imidazoles, and Lewis acids such as complexes of boron trifluoride with amines or ethers. Examples of antifoaming agents are hydrophobic silicas such as silicone resins and silanes, fluorocarbons such as polytetrafluoroethylene, fatty acid amides such as ethylenediamine distearamide, sulfonamides, hydrocarbon waxes, and solid fatty acids and esters. Examples of fillers are alumina, carbon blacks, calcium carbonate, kaolin clay, mica, silicas, talc, and wood flour.

The proportions of the components of the filler-containing resin may vary, and optimal formulations may vary with the materials used for the lid and the die and the curing conditions. One example of a resin combination (in weight percents) is 16% ARALDITE 1273 (an epoxy cresol novolak resin, Ciba Geigy Corporation, Hawthorne, N.Y., USA), 5% ARALDITE MY0510 (a multifunctional amine-based epoxy, Ciba Geigy Corporation), 5% EPI-REZ 8005 (a modified bisphenol A, Shell Chemical Company, Houston, Tex., USA), 0.3% AF-9000 (a silicone antifoaming agent, GE Silicones, Waterford, N.Y., USA), 0.2% R202 AEROSIL (amorphous silica, DeGussa Corporation, Dublin, Ohio, USA), 2% dicyandiamide, and 71% aluminum nitride powder (10 micron). Other examples will be readily apparent to those skilled in the art. All components are generally available from resin suppliers.

A tack-free resin is one which at room temperature will not adhere to solid objects upon contact, despite being pre-adhered to the surface of the lid. As a semi-solid, the resin is in a condition that does not flow but is readily compressed, stretched or otherwise changed in shape by manual pressure. The resin is preferably in a partially cured state, and is thermoplastic, remaining tack-free and non-flowing until heated to a temperature of 50° C. or higher, at which point the resin will soften and become tacky. The resin is preferably one which will fully cure at a temperature of about 150° C. to about 175° C. The fully cured resin is solid and no longer thermoplastic.

The filler material is a heat conductive particle, preferably dispersed uniformly throughout the resin. The most useful filler materials are those which have a high thermal conductivity and a low electrical conductivity. In terms of the resin in which the material is dispersed, the most useful materials are those which are chemically inert relative to the resin and wettable by the resin. Examples of materials useful in general as the filler material are alumina, aluminum nitride, silicon nitride, boron nitride, silicon carbide, and combinations of these materials. Particular materials in this group may be optimal for particular resins, as will be understood by those of skill in the art. Preferred among these materials are alumina and aluminum nitride, and mixtures of the two. Flaked or powdered metals such as aluminum, copper and silver can also be used, provided that they do not conduct substantial electricity from the die to the lid. Flaked or powdered metals are best used in combination with metal compounds such as oxides, carbides or nitrides.

The particle size of the thermally conductive filler may vary widely. Best results are usually achieved with particles having diameters within the range of about 5 microns to about 20 microns, and preferably about 10 microns. The amount of this filler dispersed throughout the resin can also vary, depending on the heat output of the circuit and the materials and dimensions of the package components. Best results are obtained using at least about 60% filler by weight, preferred amounts being within a range of about 60% to about 85% by weight, with 70% by weight being a typical average.

The resin and filler combination can be formulated by simply combining the resin ingredients with the filler in the desired proportions, and applying the mixture while still wet to the lid surface. The ingredients can be combined in a volatile solvent to achieve a fluid mixture which is readily applied to the lid undersurface. The solvent can then be evaporated to leave the ingredient combination in the tack-free, semi-solid state. Alternatively, the ingredient mixture can be formulated without a solvent by using prepolymers of molecular weights selected such that moderate heating well below the curing temperature will render the mixture liquid and flowable. The mixture is applied to the lid in this state, then cooled to room temperature where it assumes the tack-free semi-solid state.

The amount of resin and filler combination applied to the lid can vary, although the amount should be sufficient to provide an effective heat flow rate from the die to the lid, yet not so much as to fill the lid with the die inside. Since the die will generally contain wire bonds only along its periphery, the resin is preferably applied to the lid undersurface at a location which will be directly over the center of the die. This is generally the active area of the die where the heat is generated. The amount of resin thus applied is ideally small enough that any lateral flow of the resin upon heating will not reach the wire bonds. Preferably, however, the resin and filler combination are formulated to be suitable as well for applications in which the resin does reach the wire bonds. Thus formulated, the resin and filler combination can coat or encapsulate the wire bonds without interfering with the functional performance of the package. Nevertheless, the preferred application is a thin layer of resin and filler applied to the center of the lid undersurface surrounded by a margin of exposed undersurface. The optimal amount for any particular application is readily determinable by a package manufacturer, given the dimensions of the package components.

In packages where the lid is sealed to the substrate by a beta-stageable adhesive, the adhesive may be of a composition similar to the resin used in the resin-filler combination on the undersurface of the lid. Examples once again are silicones, epoxies, polyurethanes, polyimides, polyolefins, polyesters, phenolic resins, alkyd resins, and acrylic resins. Suitable adhesive formulations will often also include antifoaming agents, curing agents and fillers of the types listed above. The adhesive can be a partially cured polymer in a thermoplastic state, preapplied to one or both of the mating surfaces in tack-free, semi-solid form. Curing of the adhesive is then achieved by heat and pressure. In preferred embodiments of this invention, the adhesive and the resin in the resin/filler combination have similar curing cycles so that they can be cured simultaneously.

One example of an adhesive formulation (in weight percents) is 43% QUATREX 1410 (polymers of epoxy resin and bisphenol A, Dow Chemical Company, Midland, Mich., USA), 20% methyl cellosolve, 4% ARALDITE MY0510, 9% EPI-REZ 8005, 0.7% AF-9000, 0.6% A-187 organosilane ester (OSI-Union Carbide, Danbury, Conn., USA), 2.3% talc, 18.4% silica, 0.2% R-202 AEROSIL, and 3.1% dicyandiamide. Other examples will be readily apparent to those skilled in the art. All components are generally available from resin suppliers. Microspheres of a hard, inert material such as glass can be mixed in with the resin components to maintain the spacing between the surfaces being bonded together so that the adhesive will remain in place.

The curing of the resins, including the sealing of the package and the establishment of the thermal bridge between the die and the lid, can be accomplished by methods already in use in the industry for the assembly of integrated circuit packages. One example of an apparatus for sealing the package in an isothermal manner is that disclosed in Ross, et al., U.S. Pat. No. 5,056,296, issued Oct. 15, 1991, whose contents are incorporated herein by reference.

Figure 2:
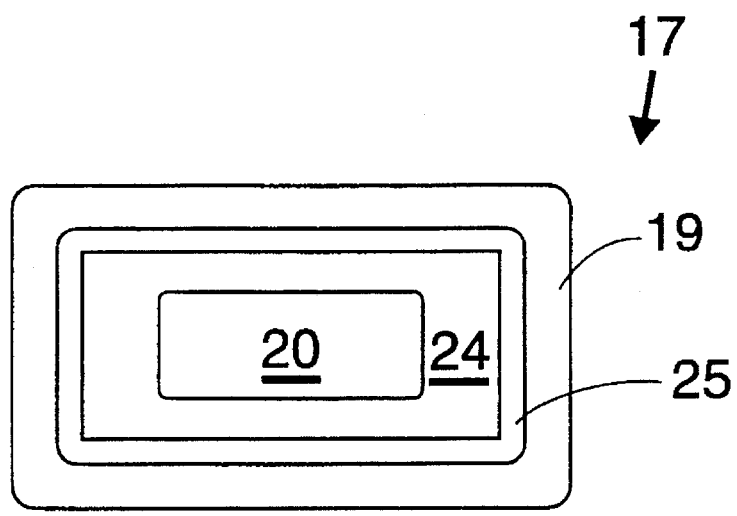
FIG. 2 depicts the underside of a metal lid forming part of the integrated circuit package of FIG. 1.
Figure 3:
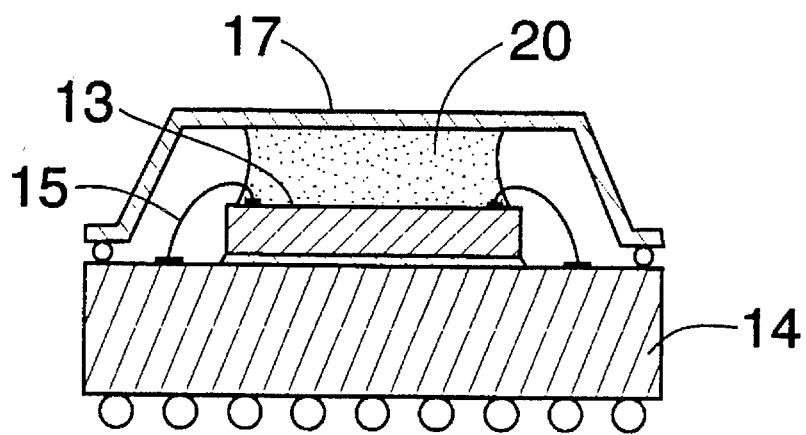
FIG. 3 is a side cross section view identical to that of FIG. 1, after sealing.

FIGS. 1, 2 and 3 illustrate one example of how the present invention is implemented. FIG. 1 shows the components of integrated circuit package 11 assembled but prior to being bonded together. The package is a ball grid array package with an array of solder balls 12 on its underside. The die 13 is already bonded to the printed wiring board 14 with the wire leads 15 soldered to the conductive paths 16 on the board. The metal lid 17 rests on the surface of the board 14 and surrounds the die 13 and wire leads 15. A layer or bead of partially cured beta-stageable edge adhesive 18 in tack-free semi-solid form rests between the peripheral flange 19 of the lid and the board surface, the adhesive having been pre-applied to the flange 19. A layer of partially cured beta-stageable resin 20, also in tack-free semi-solid form, containing particles of heatconductive material such as alumina is adhered to the underside of the lid 17.

The view shown in FIG. 2 is the underside of the lid 17 shown in FIG. 1. The resin layer 20 is shown, but the edge adhesive has been omitted. The resin layer 20 is centered on the lid, within a margin 24 between the resin and the sloping walls 25 of the lid.

FIG. 3 shows the package after heat and pressure have been applied to seal the lid 17 to the printed wiring board 14. The edge adhesive 18 has been compressed to effect a reliable seal, and cured, and the particle-filled resin 20 has softened and flowed to contact the die 13, then cured to solid form to form a thermally conductive bridge between the die and the lid.

Figure 4:
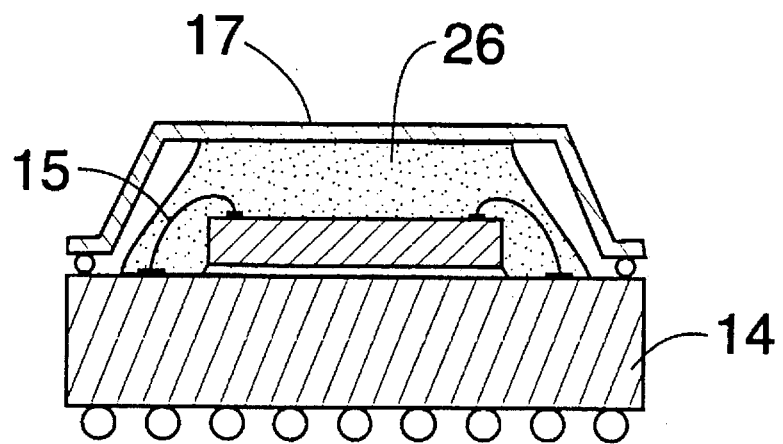
FIG. 4 is a side cross section view similar to that of FIG. 3, except that a greater quantity of filler-containing resin is used.

FIG. 4 shows the package after the lid 17 has been sealed to the printed wiring board 14, using a larger amount of particle-filled resin 26, such that the cured resin fully encapsulates the wire leads 15.

The foregoing is offered primarily for purposes of illustration. It will be readily apparent to those skilled in the art that the materials, dimensions, shapes, assembly procedures, curing conditions and other parameters of the method and package described herein may be further modified or substituted in various ways without departing from the spirit and scope of the invention.

What is claimed is:

1. A combination of components for assembly into an integrated circuit package, said combination comprising:

a substrate bearing a printed circuit which includes an array of electrical contact areas:

a die bearing an integrated circuit with conductive leads mounted thereto and arranged to contact said electrical contact areas of said substrate when said die is placed on said substrate: and a concave metal lid sufficiently large to enclose said die when said die and said lid are placed on said substrate; and a thermoplastic heat-curable resin containing a thermally conductive particulate material uniformly dispersed throughout said thermoplastic heat-curable resin and comprising at least about 60% by Weight of said resin, said resin adhering to a concave inner surface of said lid and positioned to contact said die when said die and said lid are placed on said substrate.

2. A combination in accordance with claim 1 in which said thermoplastic heat-curable resin is a tack-free semi-solid resin.

3. A combination in accordance with claim 2 in which said tack-tree semi-solid resin is comprised of a member selected from the group consisting of silicones, epoxies, polyurethanes, polyimides, polyolefins, polyesters, phenolic resins, alkyd resins, and acrylic resins.

4. A combination in accordance with claim 2 in which said thermoplastic heat-curable resin is comprised of a member selected from the group consisting of silicones, epoxies, and polyurethanes.

5. A combination in accordance with claim 2 in which said thermoplastic heat-curable resin is comprised of an epoxy.

6. A combination in accordance with claim 1 in which said thermally conductive particulate material is a member selected from the group consisting of alumina, aluminum nitride, silicon nitride, boron nitride, silicon carbide, and combinations thereof.

7. A combination in accordance with claim 1 in which said thermally conductive particulate material is a member selected from the group consisting of alumina, aluminum nitride, and combinations thereof.

8. A combination in accordance with claim 1 in which said thermally conductive particulate material comprises from about 60% to about 85% by weight of said thermoplastic heat-curable resin.

9. A combination in accordance with claim 1 in which said thermally conductive particulate material comprises particles of diameters ranging from about 5 microns to about 20 microns.

10. A combination in accordance with claim 1 in which said metal lid is formed from a member selected from the group consisting of steel, copper, nickel, zinc, chromium and aluminum.

11. A combination in accordance with claim 1 in which said metal lid is formed from a member selected from the group consisting of steel and copper.

12. A combination in accordance with claim 1 further comprising a heat-curable adhesive applied either to said substrate or to a circumferential rim of said lid to bond said lid to said substrate upon curing.

13. A die cover for an integrated circuit package, comprising:

a concavely shaped metal lid; and a thermoplastic heat-curable resin containing a thermally conductive particulate material uniformly dispersed throughout said thermoplastic heat-curable resin and comprising at least about 60% by weight of said resin, said resin adhering to a concave inner surface of said lid.

14. A die cover in accordance with claim 13 in which said thermoplastic heat-curable resin is a tack-free semi-solid resin.

15. A die cover in accordance with claim 14 in which said tack-free semi-solid resin is comprised of a member selected from the group consisting of silicones, epoxies, polyurethanes, polyimides, polyolefins, polyesters, phenolic resins, alkyd resins, and acrylic resins.

16. A die cover in accordance with claim 14 in which said tack-free semi-solid resin is comprised of a member selected from the group consisting of silicones, epoxies, and polyurethanes.

17. A die cover in accordance with claim 14 in which said thermoplastic heat-curable resin is comprised of an epoxy.

18. A die cover in accordance with claim 13 in which said thermally conductive particulate material is a member selected from the group consisting of alumina, aluminum nitride, silicon nitride, boron nitride, silicon carbide, and combinations thereof.

19. A die cover in accordance with claim 13 in which said thermally conductive particulate material is a member selected from the group consisting of alumina, aluminum nitride, and combinations thereof.

20. A die cover in accordance with claim 13 in which said thermally conductive particulate material comprises from about 60% to about 85% by weight of said thermoplastic heat-curable resin.

21. A die cover in accordance with claim 13 in which said thermally conductive particulate material comprises particles of diameters ranging from about 5 microns to about 20 microns.

22. A die cover in accordance with claim 13 in which said metal lid is formed from a member selected from the group consisting of steel, copper, nickel, zinc, chromium and aluminum.

23. A die cover in accordance with claim 13 in which said metal lid is formed from a member selected from the group consisting of steel and copper.

* * * * *